United States Patent
Schiebel

(10) Patent No.: US 7,028,392 B1
(45) Date of Patent: Apr. 18, 2006

(54) DEVICE FOR FITTING A SUBSTRATE WITH A FLIP CHIP

(75) Inventor: Günter Schiebel, München (DE)

(73) Assignee: Siemens Dematic AG, Nuremberg (DE)

( * ) Notice: Subject to any disclaimer, the term of this patent is extended or adjusted under 35 U.S.C. 154(b) by 0 days.

(21) Appl. No.: 09/914,906

(22) PCT Filed: Mar. 1, 2000

(86) PCT No.: PCT/DE00/00612

§ 371 (c)(1),
(2), (4) Date: Sep. 5, 2001

(87) PCT Pub. No.: WO00/54564

PCT Pub. Date: Sep. 14, 2000

(30) Foreign Application Priority Data

Mar. 5, 1999 (DE) ................ 199 09 775

(51) Int. Cl.
*B23P 19/00* (2006.01)

(52) U.S. Cl. ............... 29/740; 29/739; 29/832; 29/792; 414/737; 414/751.1; 414/752.1; 901/40; 294/64.1

(58) Field of Classification Search ........... 29/739, 29/740, 832, 771, 785, 792; 414/737, 751.1, 414/752.1; 301/40; 294/64.1
See application file for complete search history.

(56) References Cited

U.S. PATENT DOCUMENTS

| | | | | |
|---|---|---|---|---|
| 4,143,776 A | * | 3/1979 | Meyers et al. | ...... 198/346.2 |
| 4,915,565 A | * | 4/1990 | Bond et al. | ........ 29/740 |
| 5,501,005 A | * | 3/1996 | Onitsuka | ........ 29/833 |
| 5,586,387 A | * | 12/1996 | Nakatani et al. | ........ 29/703 |
| 5,667,129 A | | 9/1997 | Morita et al. | |
| 5,671,530 A | | 9/1997 | Combs et al. | |
| 5,839,187 A | | 11/1998 | Sato et al. | |
| 5,952,841 A | * | 9/1999 | Hiruta | ........ 324/758 |

FOREIGN PATENT DOCUMENTS

| | | |
|---|---|---|
| EP | 0895450 A2 | 2/1999 |
| JP | 60-16433 A | 1/1985 |
| JP | 62-26833 A | 2/1987 |
| JP | 01-61027 A | 3/1989 |
| JP | 02-56944 A | 2/1990 |
| JP | 02-226737 A | 9/1990 |
| JP | 03-29334 A | 2/1991 |
| JP | 08-227904 A | 9/1996 |

OTHER PUBLICATIONS

Spur, G., Handbuch der Fertigungstechnik, Bd. 5, Fügen, Handhaben und Montiersen, Seite 713 bis 719, Carl Hanser Verlag, München, ISBN 3-446-12536-1.

* cited by examiner

*Primary Examiner*—Richard Chang
(74) *Attorney, Agent, or Firm*—Harness, Dickey & Pierce, P.L.C.

(57) ABSTRACT

A freely positionable placement head (1) removes presented flip chips (6) from a wafer (5), the connection side of said chips being directed upward. The placement head has a turning device (9), in which, by the time they are placed onto a substrate (8) to be provided with placed components, the flip chips are turned in such a way that they can be placed with their connection side onto the substrate.

This makes it possible to dispense with a complex turning device assigned to the wafer (5).

10 Claims, 1 Drawing Sheet

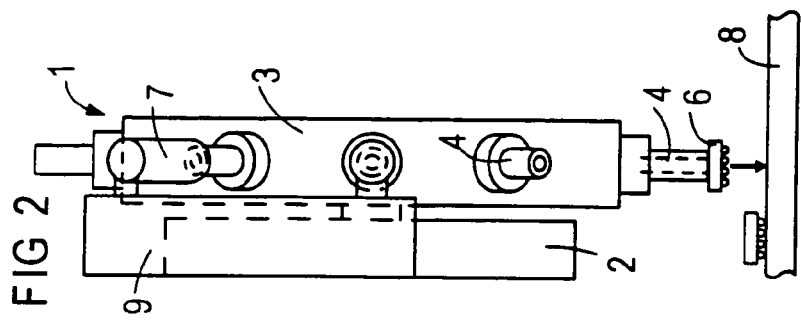
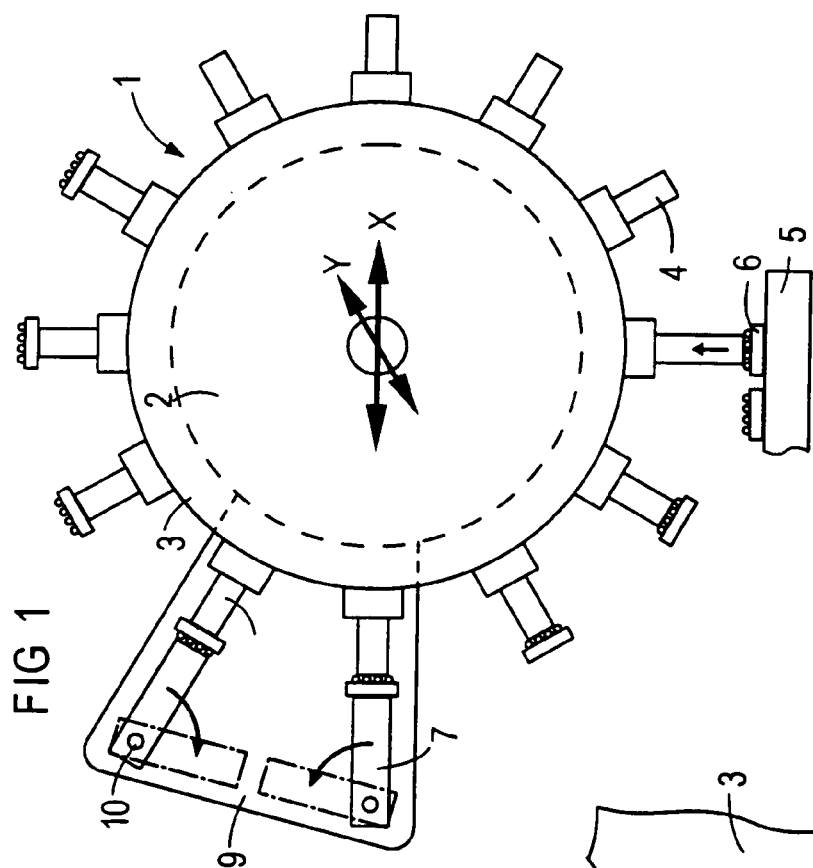
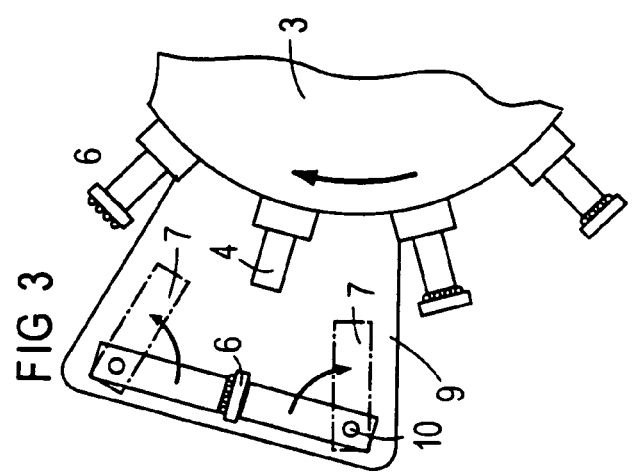

DEVICE FOR FITTING A SUBSTRATE WITH A FLIP CHIP

BACKGROUND OF THE INVENTION

The invention relates to a device for placing flip chips on a substrate or base in the form of a leadframe. The device has a movable placement head, which picks up the flip chips from a stock of components and places them on the base or substrate.

Flip chips of this type are usually presented with their connection elements pointing upward. What are known as wafer handlers are provided with a turning device for the flip chips, so that the placement head, which can move in a placement plane, of a placement device can pick up the flip chips in their correct insertion position and place them onto a printed-circuit board at the intended position for this purpose.

The flip chips are presented, for example in accordance with JP 161027 A (cf. Patent Abstracts of Japan, vol. 13, No. 270, of Jul. 21, 1989), in a wafer with their connection elements pointing upward. A movable removal head of a wafer handler removes the flip chips from the wafer and deposits the chips on a stationary turning device, by means of which the chips are deposited in a turned position on a transfer station, from which the removal head picks them up and places them in the correct insertion position with the connections downward onto a semiconductor substrate, which is usually in the form of a strip-like leadframe for the production of packaged components and is passed through the placement station in a cyclical manner.

U.S. Pat. No. 5,839,187 discloses a device for the handling of flip chips, in which the flip chips are removed from a wafer by means of a gripper. The gripper is pivoted about a horizontal axis and, turned in a transfer station to invert the chip which is then transferred to a positioning gripper, which deposits the flip chips into a flat magazine.

U.S. Pat. No. 5,667,129 A (claim 7) discloses a placement head for placing flip chips on a substrate, and the placement head has a turning device (not represented in any more detail) for the flip chips.

SUMMARY OF THE INVENTION

The invention is based on the object of reducing the complexity of a device for the placement of components on the substrates.

This object is achieved by a device which has a movable placement head which has a turret with a plurality of grippers mounted for rotation on a stationary part, which has a flipping device adjacent the path of movement of the grippers. The flipping device takes a chip from the gripper in a first holding station, flips the chip and returns the flipped chip to a gripper downstream of the first holding station.

The freely positionable placement head can be moved in a positioning system in such a way that its range of movement covers the entire area of the wafer and the fixed substrate, for example in the form of a printed-circuit board. The placement head can therefore remove the flip chips directly from the wafer, move over to the substrate, flip the chip in the accompanying turning device in the time between the pickup and placement on the substrate and, after flipping the chip, place the flip chip onto the substrate. This measure allows all the essential functions of the pickup, transportation, turning and placement of the components to be carried out with a single handling system in a time-saving manner, and makes it possible to dispense entirely with the wafer handler. The use of a turret placement head makes it possible to pick up a multiplicity of flip chips in rapid succession from the wafer and turn them between two holding stations. Subsequently, the multiplicity of flip chips held on the grippers are placed on the substrate in just as rapid succession. This considerably reduces the number of movement operations, which reduction is accompanied by a corresponding time saving. The placement head also has the advantage that a single flipping station is required for all the components held on the grippers and that the respective gripper does not have to wait for the complete flipping operation, but instead the component is passed on to the next station as the component is flipped and can be picked up again without losing any cycle time.

The development of the flipping device having two pivotable holders with one aligned with the first holding station and the other aligned with a downstream station and the two holders being pivoted to face each other in a mutual transfer station realizes the flipping device in a simple way with few additional elements.

The development of the grippers being suction grippers extending radially from the turret and the two holders being suction pipettes mounted to pivot on axes extending perpendicular to the radially extending grippers and arranged on an axial extension of the grippers allows flip chips to be safely transferred between the various suction surfaces.

The development of the gripping ends of the holders while in the transfer position being spaced apart a distance greater than the thickness of the flip chip allows flip chips of different thicknesses to be handled without readjustments.

The development of the first and second holding stations being adjacent each other allows the flipping device to be of compact and lightweight design.

The invention is explained in more detail below on the basis of an exemplary embodiment represented in the drawing.

BRIEF DESCRIPTION OF THE DRAWINGS

FIG. 1 shows in a schematized form a side view of a placement head for flip chips;

FIG. 2 shows another side view of the placement head according to FIG. 1; and

FIG. 3 shows a detail of the placement head according to FIG. 1 in another working phase.

DESCRIPTION OF THE PREFERRED EMBODIMENT

According to FIGS. 1 and 2, a turret-like placement head 1 has a stator 2 and a rotor 3, on which a multiplicity of radially protruding grippers 4 are arranged in a circulating manner. The placement head 1 is freely positionable in the direction of the perspectively represented arrows X and Y in a plane parallel to the wafer and the substrate. In the position represented in FIG. 1, it is located over a wafer 5, on the upper side of which flip chips 6 are presented close together in rows with their connection side facing upward.

The gripper 4, located in the lower turning position, is directed at one of the flip chips 6 and can be telescopically lowered onto it. The flip chip is sucked onto the end of the gripper and lifted together with the latter off the wafer 5. By moving the placement head 1 and turning the rotor 3, all the grippers 4 can be successively loaded with the flip chips 6. One of the holding stations of the grippers, which is shown as a gripper 4a, is assigned a first holder 7, which is aligned by its end with the end of the gripper 4a.

The flip chip 6 sucked onto the gripper 4a can then be transferred to the holder 7 and sucked onto the end of the latter. By pivoting the holder 7 into a transfer position, represented by dash-dotted lines, the flip chip 6 can be transferred to a further or second holder 7a, which is directed oppositely facing the first holder and which then takes up the flip chip 6 on its connection side or gripping end. The second holder 7a is assigned to a downstream holding station of the placement head 1, which has a gripper 4b. It can be pivoted out of the transfer position into a delivery position, which is in line with the gripper 4b of the second holding station and in which the gripper 4b receives the component on its upper side, facing away from the connection side.

In FIG. 3 it is shown how the flip chip 6 can be transferred between the holders 7 and 7a and turned in a time-saving manner during the rotation of the rotor 3.

After the flipping of the flip chips 6, they are successively transported into a placement position, represented in FIG. 2, in which they can be placed in the correct position onto a substrate or base 8 to be provided with placed components.

I claim:

1. A device for placing flip chips on a substrate in the form of a leadframe, the device comprising a movable placement head, which picks up the flip chips from a stock of components and places them on the substrate, the placement head being provided with a flipping device for the flip chips, the placement head being provided with a multiplicity of grippers circulating in a turret-like indexed manner, the flipping device being assigned to a stationary part of the placement head, the flipping device taking one of the flip chips in a first holding station of the grippers and after flipping the chip, returning the flipped chip to one of the grippers in one of the downstream holding stations.

2. The device as claimed in claim 1, wherein the flipping device has two pivotable holders, one of the two holders can be aligned with the first of the holding stations, and a second holder of the two holders can be aligned with a downstream one of the holding stations and wherein the two holders can be pivoted into a mutual transfer position, in which their ends, carrying the flip chip and projecting toward each other, are aligned with each other.

3. The device as claimed in claim 2, wherein the holders are designed as pivotably mounted suction pipettes, wherein the grippers are designed as suction grippers protruding radially from the placement head, wherein the holders have pivoting axes extending perpendicular to a turning plane of the grippers and being arranged on axial extensions of the grippers and wherein longitudinal axes of the holders and of the grippers are in line with one another during the transfer of the flip chips therebetween.

4. The device as claimed in claim 3, wherein a clearance between the holders directed oppositely facing each other and in line with each other in the transfer position is somewhat larger than the thickness of the flip chips.

5. The device as claimed in claim 4, wherein the first and downstream holding stations are arranged immediately following each other.

6. A device according to claim 3, wherein the first and downstream holding stations are arranged immediately following one another.

7. A device according to claim 2, wherein a clearance between the holders while facing each other in the transfer position is larger than the thickness of the flip chips.

8. A device according to claim 7, wherein the first and downstream holding stations are arranged immediately following each other.

9. A device according to claim 2, wherein the downstream holding station is arranged to immediately follow the first holding station.

10. A device according to claim 1, wherein the downstream holding station immediately follows the first holding station.

* * * * *